(12) United States Patent
Chiu et al.

(10) Patent No.: US 9,386,709 B2
(45) Date of Patent: Jul. 5, 2016

(54) METHOD OF MANUFACTURING PRINTED CIRCUIT BOARD

(71) Applicant: ICHIA TECHNOLOGIES, INC., Taoyuan County (TW)

(72) Inventors: Chien-Hwa Chiu, Taoyuan County (TW); Chih-Min Chao, Taoyuan County (TW); Peir-Rong Kuo, Taoyuan County (TW); Chia-Hua Chiang, Taoyuan County (TW); Chih-Cheng Hsiao, Taoyuan County (TW); Feng-Ping Kuan, Taoyuan County (TW); Ying-Wei Lee, Taoyuan County (TW); Wei-Cheng Lee, Taoyuan County (TW)

(73) Assignee: ICHIA TECHNOLOGIES, INC., Taoyuan County ( * ) Notice: Subject to any disclaimer, the term of this patent is extended or adjusted under 35 U.S.C. 154(b) by 59 days.

(21) Appl. No.: 14/058,504

(22) Filed: Oct. 21, 2013

(65) Prior Publication Data
US 2015/0021069 A1    Jan. 22, 2015

(30) Foreign Application Priority Data

Jul. 17, 2013  (TW) .............................. 102125524 A

(51) Int. Cl.
*H05K 3/02* (2006.01)
*H05K 3/10* (2006.01)
(Continued)

(52) U.S. Cl.
CPC ................ *H05K 3/46* (2013.01); *C23C 28/021* (2013.01); *C23C 28/023* (2013.01); *C23C 28/32* (2013.01); *H05K 1/09* (2013.01); *H05K 1/118* (2013.01); *H05K 3/426* (2013.01); *H05K 3/06* (2013.01); *H05K 3/181* (2013.01); *H05K 3/381* (2013.01); *H05K 2201/0338* (2013.01); *Y10T 29/49124* (2015.01); *Y10T 29/49155* (2015.01)

(58) Field of Classification Search
CPC ................. H01L 2924/1517; Y10T 29/49155; Y10T 29/49117; Y10T 428/31721; Y10T 29/49124; H05K 3/185; H05K 2201/0373; H05K 2203/025; H05K 2203/0353; H05K 2203/0709; H05K 3/46; C25D 5/54; C25D 5/02
USPC ................... 29/846, 829, 830, 831, 832, 852; 174/250, 257, 258, 260, 266
See application file for complete search history.

(56) References Cited

U.S. PATENT DOCUMENTS 6,523,256 B1 * 2/2003 Oura ................... C23C 18/1608
                                                        174/257

FOREIGN PATENT DOCUMENTS

JP          1992-235285      8/1992
JP          1994-021157 A    1/1994
(Continued)

*Primary Examiner* — Thiem Phan
(74) *Attorney, Agent, or Firm* — Li & Cai Intellectual Property (USA) Office

(57) ABSTRACT

A method of manufacturing a printed circuit board precursor includes the steps of providing a substrate. Then the surface of the substrate is catalyzed to form a catalytic layer by a catalyst. Subsequently, a conductive layer is formed and attached to the surface of the catalytic layer. Finally, a metal layer is electroplated on the conductive layer. A printed circuit board precursor includes a substrate having a surface. Specifically, the surface is catalytically treated to form a catalytic layer. The precursor also includes a conductive layer which is attached to and covers the catalytic layer and a metal layer which is disposed on the conductive layer.

9 Claims, 5 Drawing Sheets

(51) Int. Cl.
*H05K 3/46* (2006.01)
*C23C 28/00* (2006.01)
*H05K 1/09* (2006.01)
*H05K 1/11* (2006.01)
*H05K 3/42* (2006.01)
*C23C 28/02* (2006.01)
*H05K 3/06* (2006.01)
*H05K 3/18* (2006.01)
*H05K 3/38* (2006.01)

(56) References Cited

FOREIGN PATENT DOCUMENTS

| | | |
|---|---|---|
| JP | 2005-294700 A | 10/2005 |
| JP | 2011-014801 A | 1/2011 |
| KR | 1020070063396 | 2/2008 |
| TW | I255825 B | 6/2006 |
| TW | 201109468 A | 3/2011 |

* cited by examiner

METHOD OF MANUFACTURING PRINTED CIRCUIT BOARD

BACKGROUND

1. Field of the Invention

The instant disclosure relates to a printed circuit board precursor and a method of manufacturing the same and a flexible printed circuit board; in particular, to a method utilizing electroplating without electrolysis to form an electroplated layer and then electroplating a metal layer as a printed circuit board precursor.

2. Description of Related Art

Conventional flexible printed circuit board is produced by fabricating on a half-finished precursor. A metallic conductive layer is required to cover the precursor for facilitating subsequent fabrication. In general, it is difficult to apply metal on the surface of the precursor because the precursor is made of polyimide which shows less affinity to metal. Conventional treatment to the precursor includes metal spray, sputter, CVD, vapor deposition and dry spreading. However, the abovementioned methods result in a layer which is too thick or too thin, or the process of the methods is time consuming. If the precursor is too thick, it might not fit in a compact module. The yield rate is restrained by the long processing time, and the process has high tendency of failure. Therefore the production cost remains high. In addition, because the thickness of the metallic conductive layer cannot be easily controlled, a customized metallic conductive layer for a specific purpose cannot be satisfied.

Furthermore, the quality of commercially available half-finished precursors is not stable, and the options of materials are limited. Hence, there is an urgent need to provide an easier method of manufacturing the precursor, such that the overall quality can be better controlled.

To address the above issues, the inventor strives via associated experience and research to present the instant disclosure, which can effectively improve the limitation described above.

BRIEF SUMMARY OF THE INVENTION

The instant disclosure provides a method of manufacturing a printed circuit board precursor and a flexible printed circuit board to overcome the abovementioned problems. According to one embodiment of the instant disclosure, the method of manufacturing a printed circuit board precursor includes the steps of providing a substrate. Then the surface of the substrate is catalyzed to form a catalytic layer by a catalyst. Subsequently, a conductive layer is formed and attached to the surface of the catalytic layer. Finally, a metal layer is electroplated on the conductive layer.

According to another embodiment of the instant disclosure, the method of manufacturing a flexible printed circuit board includes the steps of providing a substrate. Then, the surface of the substrate is catalyzed to form a catalytic layer by a catalyst. Subsequently, a conductive layer is formed and attached to the surface of the catalytic layer. A metal layer is electroplated on the conductive layer. Following that, an anti-plating photoresistor is disposed on the metal layer. The photoresistor is then exposed and visualized according to a printed circuit board trace pattern. Specifically, a portion of the photoresistor is removed to expose a portion of the metal layer. After that, the exposed portion of the metal layer is etched through to the conductive layer and the catalytic layer. Finally, the remaining photoresistor is removed.

According to still another embodiment of the instant disclosure, the printed circuit board precursor includes a substrate having a surface. Specifically, the surface is catalytically treated to form a catalytic layer. The precursor also includes a conductive layer which is attached to and covers the catalytic layer and a metal layer which is disposed on the conductive layer.

In summary, the catalytic layer formed on the substrate acts as an attachment intermediate between the conductive layer and the substrate. The manufacturing process requires a non-electrolysis electroplating which provides tighter bonding between the conductive layer and the substrate. Comparing to the conventional technique, the thickness of the conductive layer and the time required to form the conductive layer are both greatly reduced. Therefore the cost decreases and the material options are broader. The metal layer formed on the conductive layer can be customized made to meet a desirable thickness for the flexible printed circuit board. The printed circuit board precursor can be easily implemented on different types of modules.

In order to further understand the instant disclosure, the following embodiments are provided along with illustrations to facilitate the appreciation of the instant disclosure; however, the appended drawings are merely provided for reference and illustration, without any intention to be used for limiting the scope of the instant disclosure.

DETAILED DESCRIPTION OF THE INVENTION

The aforementioned illustrations and following detailed descriptions are exemplary for the purpose of further explaining the scope of the instant disclosure. Other objectives and advantages related to the instant disclosure will be illustrated in the subsequent descriptions and appended drawings.

First Embodiment

Figure 1A:
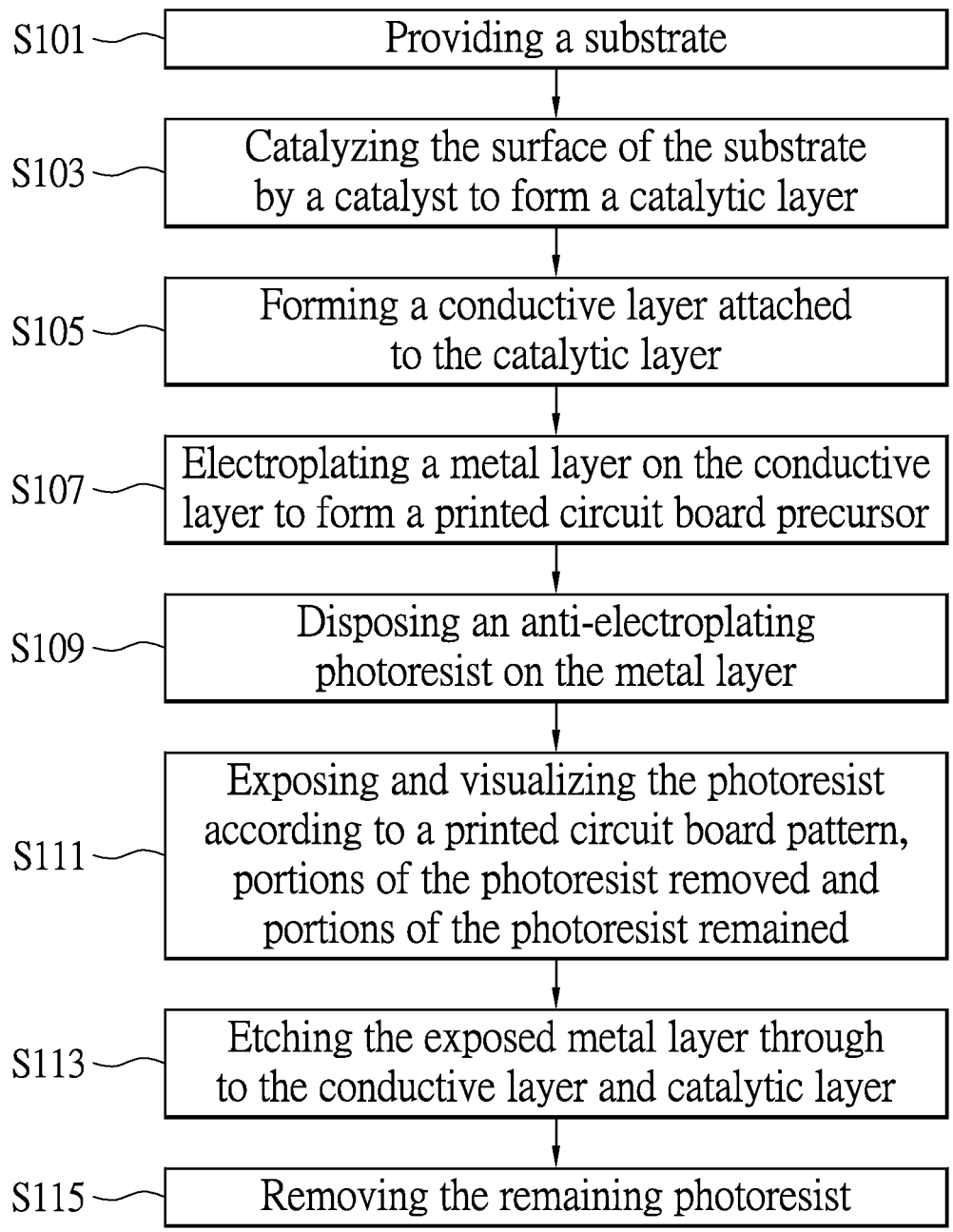
FIG. 1A is a flow chart of a method of manufacturing flexible printed circuit board in accordance with an embodiment of the instant disclosure.

Please refer to FIG. 1A which shows a flow chart of a method of manufacturing flexible printed circuit board. The method includes the following steps. Please refer to FIG. 2A. First of all, a substrate 10 is provided (step S101). The substrate 10 has a surface 11 which is further defined as a top surface 111 and a bottom surface 112. The substrate 10 is a raw material selected from polyimide, polyethylene terephthalate, polyethylene naphthalate, polytetrafluorethylene, thermotropic liquid crystal polymer, epoxy, aramid or the like. Please refer to FIG. 2B. The substrate 10 is cut by laser beams to form a channel 12 which completely goes through the substrate 10. The formation of the channel 12 allows the connection between the top surface 111 and the bottom surface 112 via a continuous wall 113. The substrate 10 is then plasma cleaned to remove the residues produced by laser cutting.

Figure 2A:
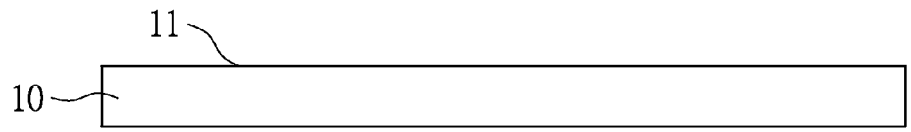
FIG. 2A to 2I are schematic diagrams showing a method of manufacturing flexible printed circuit board in accordance with an embodiment of the instant disclosure.
Figure 2B:
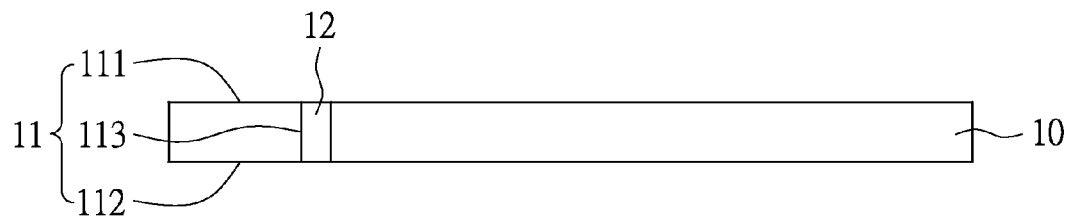
Figure 2C:
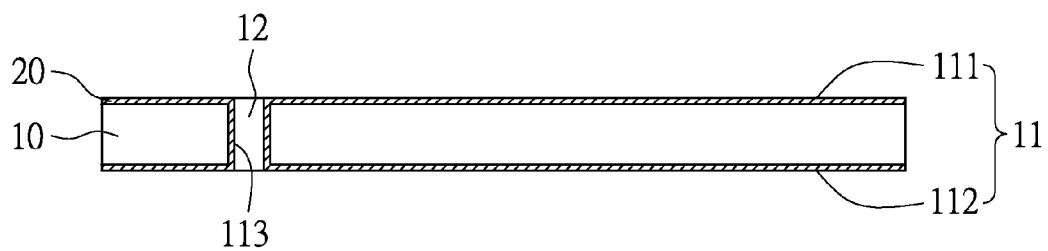
Figure 2D:
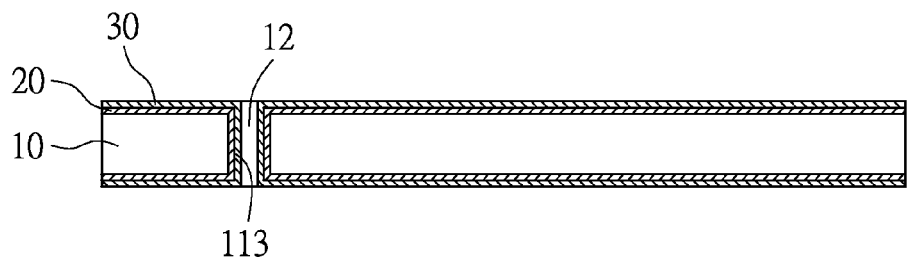

Please refer to FIGS. 2C and 2D. The surface 11 of the substrate 10 is catalyzed by a catalyst to form a catalytic layer 20 (step S103). Specifically, the catalytic layer 20 covers the top surface 111, bottom surface 112 and continuous wall 113. Furthermore, the catalytic layer 20 may be partially mixed or doped into the top surface 11, bottom surface 112 and continuous wall 113. Preferably, the catalyst contains palladium. Subsequently, a conductive layer 30 is formed and attached on the catalytic layer 20. In the presence of the catalytic layer 20, the conductive layer 30 is attached to the surface 11 of the substrate 10 (step 105). The channel 12 may be omitted for different designing purposes. Preferably, the thickness of the conductive layer 30 ranges from 50 to 200 nanometers. The material of the conductive layer 30 is selected from the group consisting of copper, nickel, chromium, cobalt, nickel alloy and cobalt alloy. Moreover, the conductive layer 30 undergoes non-electrolysis electroplating to attach onto the substrate 10, and therefore the conductive layer 30 itself is a non-electrolysis electroplating layer.

Please refer to 2E. A metal layer 40 is electroplated on the surface of the conductive layer 30 to form a printed circuit board precursor P (step S107). The thickness of the metal layer 40 may vary according to different designs. Preferably, the metal layer 40 should have a thickness ranges from 1 μm to 18 μm. Specifically, the metal layer 40 coats the substrate 10 where the conductive layer 30 covers.

Figure 2E:
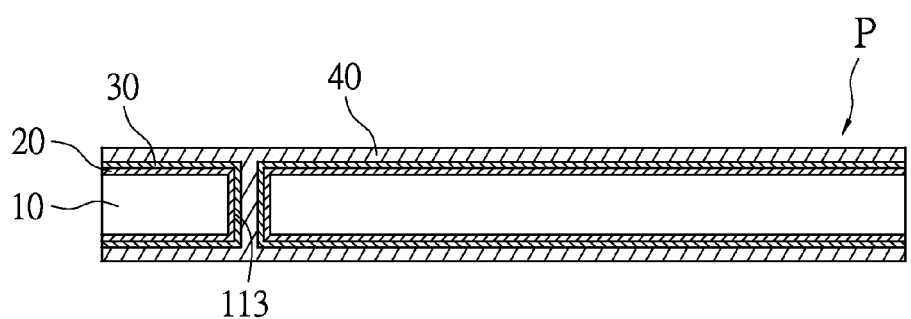
Figure 2F:
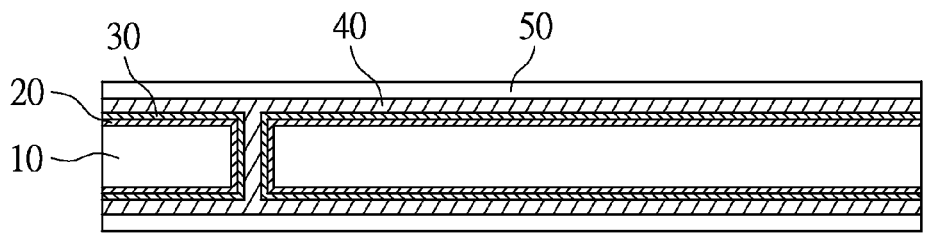
Figure 2G:
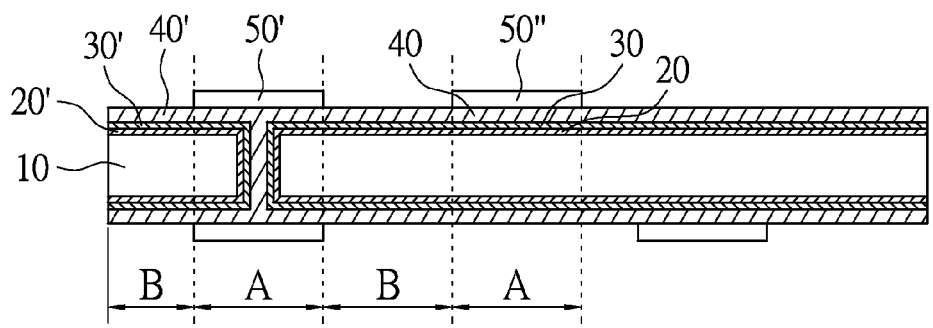

Please refer to FIG. 2F. An anti-electroplating photoresistor 50 is applied on the metal layer 40 (step S109). The types of the photoresistor 50 may vary according to design requirement. For example, the photoresistor 50 may be a positive photoresistor or a negative photoresistor. Specifically, the photoresistor 50 may be secured on the metal layer 40 by adhesive. Followed by FIG. 2G, the photoresistor 50 is exposed and visualized according to a printed circuit board pattern. Then, portions of the photoresistor 50 are removed while some (50', 50") remain and the metal layer 40 is revealed (step S111). As shown in FIG. 2G, the area which is topped by the remaining photoresistor 50', 50" is defined as a shielded area A. The area in between the shielded areas A which is not covered by any of the photoresistor 50', 50" is defined as an unshielded area B. The catalytic layer 20 located in the unshielded area B is designated as catalytic layer 20' for clarity in description. The conductive layer 30 located in the unshielded area B is designated as conductive layer 30'. The metal layer 40 which is exposed is designated as metal layer 40'. The elements underneath the photoresistor 50, 50" are catalytic layer 20, conductive layer 30 and metal layer 40 as previously described.

Figure 2H:
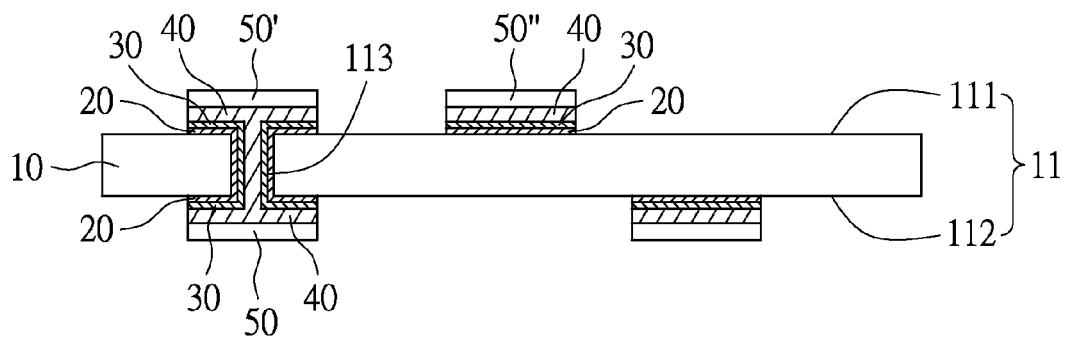
Figure 2I:
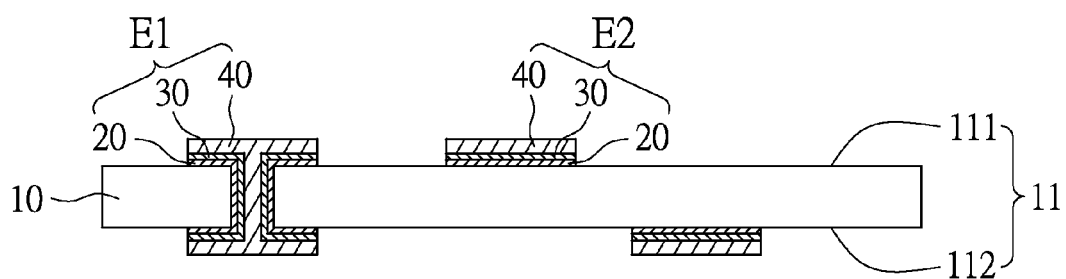

Please refer to FIGS. 2G and 2H. The exposed metal layer 40', conductive layer 30' and catalytic layer 20' are removed by etching (step S113). The metal layer 40, conductive layer 30 and the catalytic layer 20 underneath the photoresistor 50', 50" remain. Subsequently, the remaining photoresistor 50', 50" are removed (step S115). Following that, the final product of the flexible printed circuit board is complete as shown in FIG. 2I. The catalytic layer 20 and the conductive layer 30 are thinner compared to the conventional thickness thereof. The method also allows an easier process in electroplating the metal layer 40, and the thickness of the metal layer 40 can be easily controlled. Therefore, the flexible printed circuit board produced according to the abovementioned process may be customized for specific needs and its field of implementation is broadened.

In another embodiment, polyimide (PI), palladium (Pd) and nickel (Ni) are respectively used for substrate 10, catalytic layer 20 and conductive layer 30. Please refer to FIGS. 1B and 1C. Step S103 further includes a roughening step which is used to increase the surface 11 affinity to palladium. Furthermore, the combination of palladium and nickel forms the conductive layer 30. Palladium acts as a foundation for nickel attachment on the substrate 10. That is to say the nickel of conductive layer 30 and the palladium of the catalytic layer 20 may form a palladium and nickel alloy.

Figure 1B:
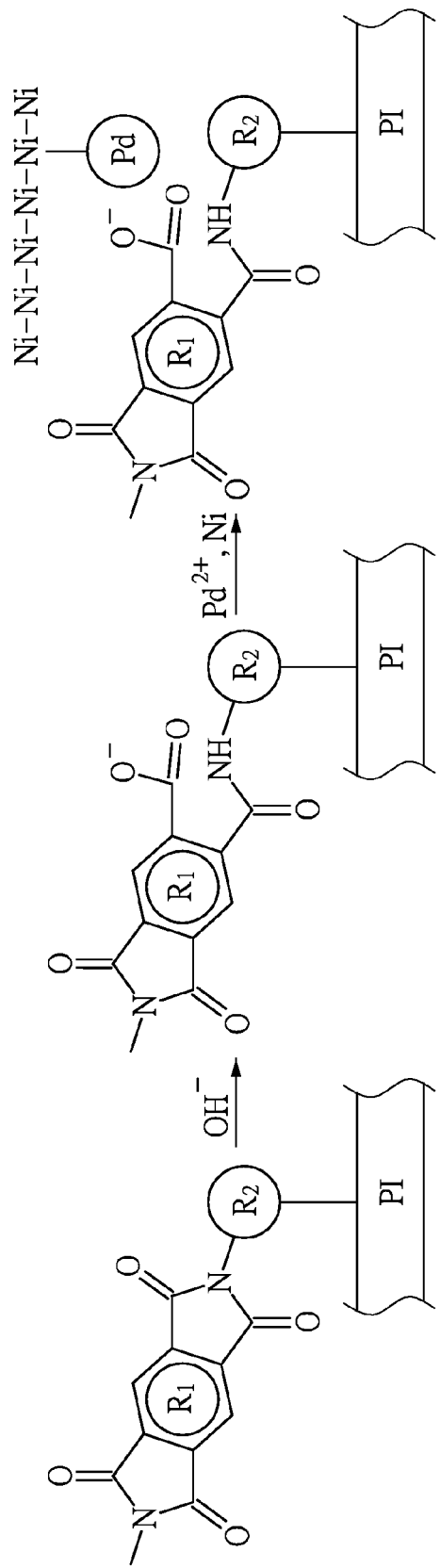
FIG. 1B is a schematic diagram illustrating a chemical mechanism in a roughening step.
Figure 1C:
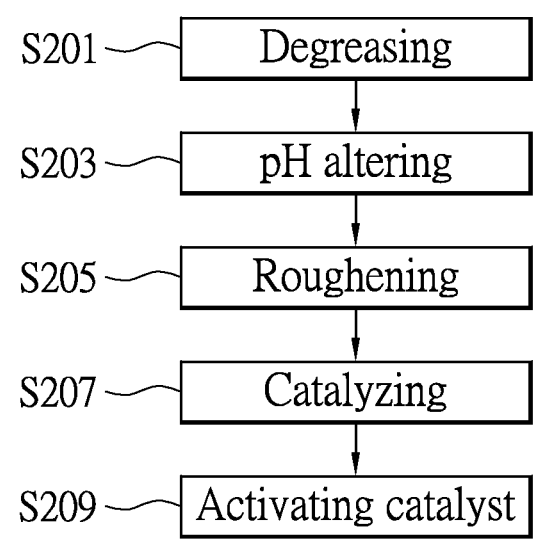
FIG. 1C is a flow chart of a roughening process.

Please refer to FIGS. 1B, 1C and 2C. The palladium affinity is increased by further processing over the substrate 10 and it includes the following steps. The substrate 10 is firstly degreased (step S201), pH altered (step S203), roughened (step S205), and catalyzed (step S207). The catalyst are then activated (step 209). In the step of roughening the substrate 10, it includes chemical or physical approach. Chemical roughening employs chemical agents to attack the surface 11 of the substrate 10 or cleave molecular rings. Physical roughening employs mechanical forces to make the surface 11 of the substrate 10 rough. Once the substrate 10 undergoes the roughening step, its capability of retaining palladium catalyst. When molecular rings are nicked, the molecular structure of the substrate 10 is no longer even which facilitates the accommodation of palladium catalysts. Specifically, in the instant embodiment, polyimide rings are cleaved to accept palladium catalyst. In other words, after the treatment with chemical agents, palladium catalysts are more easily attached to the substrate 10 to form the catalytic layer 20.

More specifically, chemical roughening which includes molecular ring cleavage is shown in FIG. 1B. In more detail, basic agent breaks any single-bond C—N of diacetylimide to cause a nick in the ring. In addition, palladium catalysts are used to bridge the connection between nickel and polyimide. It is worth noted that it is a non-electrolysis electroplating.

Please refer to FIG. 1C in conjunction with FIGS. 2A, 2B and 2C. A preferable roughening step is elaborated herein.

In step S201 the substrate 10 is washed for 1 to 3 minutes to remove any grease. The degreasing step is conducted under 45 to 55 Celsius degrees, pH 10 to 11 by amino alcohol agent (H2NCH2CH2CH2OH, agent code: ES-100).

In step S203, the substrate 10 is washed for 1 to 3 minutes to recover its normal pH value and remove any remaining ES-100. The pH altering process is conducted under 35 to 45 Celsius degrees, pH 7.5 to 8.5 in weak base, for example, sodium carbonate (agent code: ES-FE). However, this step may be omitted according to actual pH condition.

In step S205, the substrate 10 undergoes property changing to basic for 1 to 3 minutes. One of the C—N single bond of polyimide (O=C—N—C=O) is cleaved to cause a nick on the ring. The chemical roughening is conducted under 45 to 55 Celsius degrees, pH 11 to 12 in inorganic strong base, for example, potassium hydroxide (agent code: ES-200).

In step S207, catalysts are attached to the substrate 10 to form the catalytic layer 20. Specifically, palladium catalyst chemically bonds to O=C—O⁻ which is generated after the polyimide is cleaved. (ES-300 and $H_2SO_4.Pd_4$ are used as agent. The final pH value should range from 5.5 to 6.5. The operation temperature falls between 45 to 55 Celsius degrees, and the duration is approximately 1 to 4 minutes.)

In the step S209, a metal is attached to the catalytic layer 20 to form the conductive layer 30 on the surface 11 of the substrate 10. ES-400, which consists essentially of boron, activates the palladium catalyst (pH 6 to 8, temperature 30 to 40 Celsius degrees, 1 to 3 minutes). After the activation, palladium catalyst is prone to accept the metal (nickel). Following that, ES-500, which consists essentially of $NiSO_4.6H_2O$ and $NaH_2PO_2$, is also used to treat the catalyst (pH 8 to 9, temperature 35 to 45, 3 to 5 minutes). Nickel can then be easily attached to the surface 11 of the substrate 10 in the presence of palladium as an intermediate. The thickness of the nickel layer (i.e., conductive layer) ranges from 50 to 200 nanometers (nm). After treated by ES-500, the deposited nickel, which is produced by non-electrolysis electroplating, has low concentration of phosphorus (2~3%). Therefore the conductive layer 30 is less strained, and the deposition speed is approximately 100 nm every 5 minutes. The deposition speed is faster than the conventional method, and therefore the method is more time efficient.

It is also worth noting the catalytic layer 20, conductive layer 30 or top surface 111, bottom surface 112 and continuous wall 113 are clearly layered in the diagrams. However, this representation is only for illustration purpose, and the surface 11, conductive layer 30 and catalytic layer 20 may slightly merge together between the boundaries. That is to say a mixed layer (not show) is in between each layer shown in the diagram, and the attachment therebetween is therefore stronger.

Please refer to FIG. 2I. Accordingly, a flexible printed circuit board is produced. The flexible printed circuit board includes at least one layered unit (E1, E2). The layered units E1, E2 are disposed on the substrate 10. The layered units (E1, E2) include the catalytic layer 20, the conductive layer 30 and the metal layer 40. The catalytic layer 20 is disposed on the surface 11 of the substrate 10. The catalytic layer 20, conductive layer 30 and metal layer 40 are distributed over the top and bottom surfaces 111, 112 of the substrate 10. In addition, the layered unit E1 can cover the continuous wall 113, and therefore the top and bottom surfaces 111, 112 are electrically connected.

Second Embodiment

Please refer to FIG. 1A. According to the first embodiment, a printed circuit board precursor can also be produced followed by step S101 to S107. Please also refer to FIGS. 2A to 2E. The instant disclosure provides a method of manufacturing printed circuit board precursor. In the step of catalytic layer formation, roughening process is also carried out. The materials of substrate 10, conductive layer 30 and metal layer 40 are similar to the first embodiment. However, it is worth mentioning the conductive layer 30 is formed by nickel which is relatively prone to oxidization. The material of metal layer 40 is preferably copper or other metal having even lower oxidation potential. In addition to good conductivity, lower oxidation potential protects the conductive layer 30 from oxidation by air or moisture. In other words, the printed circuit board precursor can be better preserved.

Please refer to FIG. 2E. The instant disclosure also provides a printed circuit board precursor. The precursor includes the substrate 10, the catalytic layer 20 formed on the surface 11, the conductive layer 30 and the metal layer 40. The surface 11 of the substrate 10 is catalyzed to form the catalytic layer 20. The conductive layer 30 is attached to the catalytic layer 20 and covers the catalytic surface. The metal layer 40 completely coats the conductive layer 30. In the presence of the channel 12, the metal layer 40 goes through the continuous wall 113 and fills the channel 12.

In summary, the instant disclosure differs from the conventional flexible printed circuit board because of the catalytic layer which contains palladium. The method helps to reduce the overall thickness, simplify the manufacturing process, increase yield rate, reduce cost and provide the freedom in material range.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A method of manufacturing a printed circuit board precursor comprising:
   providing a substrate, wherein the substrate is formed of polyimide;
   performing a chemical roughening step, wherein the chemical roughening step is conducted under 45 to 55 Celsius degrees with pH 11 to 12 strong base to treat a surface of the substrate for a duration of 1~3 minutes;
   catalyzing the surface of the substrate to form a palladium catalytic layer by a palladium catalyst;
   using boron to activate the palladium catalyst and then forming a nickel conductive layer attaching to the surface of the palladium catalytic layer; and
   electroplating a metal layer on the nickel conductive layer.

2. The method of manufacturing a printed circuit board precursor according to claim 1, wherein in the step of catalyzing the surface of the substrate to form a catalytic layer by a catalyst further comprises roughening the substrate surface.

3. The method of manufacturing a printed circuit board precursor according to claim 2, wherein chemical agents which is corrosive or capable of breaking molecular rings are used to treat the surface of the substrate.

4. The method of manufacturing a printed circuit board precursor according to claim 2, wherein a mechanical force is applied to physically roughen the surface of the substrate.

5. The method of manufacturing a printed circuit board precursor according to claim 1, wherein the substrate material is selected from a group consisting of polyimide, polyethylene terephthalate, polyethylene naphthalate, polytetrafluoroethylene, thermotropic liquid crystal polymer, epoxy or aramid or the combination thereof.

6. The method of manufacturing a printed circuit board precursor according to claim 5, wherein the catalyst is palladium.

7. The method of manufacturing a printed circuit board precursor according to claim 1, wherein the catalyst is palladium.

8. A method of manufacturing flexible printed circuit board comprising:
   providing a substrate, wherein the substrate is formed of polyimide;
   performing a chemical roughening step, wherein the chemical roughening step is conducted under 45 to 55 Celsius degrees with pH 11 to 12 strong base to treat a surface of the substrate for a duration of 1~3 minutes;
   catalyzing the surface of the substrate to form a palladium catalytic layer by a palladium catalyst;
   using boron to activate the palladium catalyst and then forming a nickel conductive layer attaching to the surface of the catalytic layer;
   electroplating a metal layer on the conductive layer;
   disposing an anti-plating photoresistor on the metal layer;
   exposing and visualizing the photoresistor according to a printed circuit board trace pattern, wherein portions of the photoresistor is removed to expose a portion of the metal layer;
   etching the exposed portion of the metal layer through to the conductive layer and the catalytic layer; and
   removing the remaining photoresistor.

9. The method of manufacturing flexible printed circuit board according to claim 8, wherein chemical agents which is corrosive or capable of breaking molecular rings are used to treat the surface of the substrate.

* * * * *